United States Patent [19]
Wortman et al.

[11] Patent Number: 5,240,518
[45] Date of Patent: Aug. 31, 1993

[54] SINGLE CRYSTAL, ENVIRONMENTALLY-RESISTANT GAS TURBINE SHROUD

[75] Inventors: David J. Wortman, Hamilton; Brian H. Pilsner; Peter J. Linko, III, both of Cincinnati, all of Ohio

[73] Assignee: General Electric Company, Cincinnati, Ohio

[21] Appl. No.: 577,668

[22] Filed: Sep. 5, 1990

[51] Int. Cl.$^5$ ............................................. C22C 19/05
[52] U.S. Cl. ................................... 148/404; 148/410; 148/428
[58] Field of Search ..................... 148/404, 410, 428

[56] References Cited

U.S. PATENT DOCUMENTS

| | | | |
|---|---|---|---|
| 4,459,160 | 7/1984 | Meetham et al. | 148/162 |
| 4,719,080 | 1/1988 | Duhl et al. | 148/404 |
| 4,804,311 | 2/1989 | Anderson et al. | 164/122 |
| 4,923,525 | 5/1990 | Khan et al. | 148/3 |

FOREIGN PATENT DOCUMENTS 0246082 11/1987 European Pat. Off. .

*Primary Examiner*—Deborah Yee
*Attorney, Agent, or Firm*—Jerome C. Squillaro; Carmen Santa Maria

[57] ABSTRACT

A single crystal shroud, preferably used around the high pressure turbine section of a gas turbine engine, has a composition, in weight percent, of from about 5 to about 10 percent chromium, from about 5 to about 10 percent cobalt, from 0 to about 2 percent molybdenum, from about 3 to about 10 percent tungsten, from about 3 to about 8 percent tantalum, from 0 to about 2 percent titanium, from about 5 to about 7 percent aluminum, from 0 to about 6 percent rhenium, from 0 to about 0.50 percent hafnium, from 0 to about 0.07 percent carbon, from 0 to about 0.015 percent boron, and from 0 to about 0.075 percent yttrium, balance nickel. The environmentally-resistant shroud preferably is used in the as-cast condition without any oxidation and corrosion resistant flowpath coating.

3 Claims, 1 Drawing Sheet

SINGLE CRYSTAL, ENVIRONMENTALLY-RESISTANT GAS TURBINE SHROUD

CROSS REFERENCE TO RELATED APPLICATIONS

This application is related to commonly assigned application Ser. No. 07/668,816 filed Mar. 8, 1991, which is a continuation of application Ser. No. 07/253,097 filed Sep. 23, 1988, now abandoned, which is a division of application Ser. No. 06/790,439 filed Oct. 15, 1985, now abandoned.

BACKGROUND OF THE INVENTION

This invention relates to aircraft gas turbine components, and, more particularly, to the chemical composition and processing of a single crystal superalloy gas turbine shroud having improved environmental resistance and capable of use with no flow path coating.

One of the goals of aircraft engine design is to provide jet engines which operate at higher temperatures. Higher operating temperatures translate into either more efficient engine operation or more powerful engines. Operating temperatures generally are limited by the various parts making up the engine, one of which is the gas turbine shroud.

In aircraft gas turbines, air is drawn into the front end of the engine and compressed by a series of axial flow compressor stages. Fuel is injected into the air stream and the mixture is burned in a combustor. The discharge combustion gases pass through axial flow high pressure turbine stages, and low pressure turbine stages wherein energy is extracted for rotating the compressor stages. The gas then passes out of the rear of the engine.

The turbine stages are formed as stationary vanes and rotating turbine blades mounted on a turbine disk. The present invention deals with the structure of the engine in the high pressure turbine stages that are located just behind the combustors, and with the forward low pressure stages.

The high pressure turbine stages include high pressure turbine blades fixed upon cylindrical high pressure turbine disks that rotate about their cylindrical axes. The blades therefore travel in a path along the circumference of a circle. At a slightly larger radius is a stationary component known as the shroud. The shroud has several functions. First, it defines the outside of the flowpath of the hot combustion gases, acting to some extent as a seal around the hot gas flowpath. It is continuously exposed to those hot gases. Second, it aids in controlling the gas dynamics of the gas flow system and the effect of the gas stream on the rotating blades. Third, it acts as a container to minimize external damage in the event that a turbine blade fails. A shroud that performs essentially the same function may also envelop the forward stages of the low pressure turbine having a low pressure disk and low pressure turbine blades.

The shroud is an important part of the operating structure of the gas turbine engine, even though it is stationary. Such shrouds are made of high-temperature alloys, such as nickel base or cobalt base superalloys. The shroud flowpaths, which comprise the inner diameter of the shroud which may contact the turbine blades and upon which hot gases impinge, currently are coated with oxidation and corrosion resistant coatings that extend their lives in the environment of the hot combustion gases. A typical current construction for a shroud is a base structure of curved segments that slide into a circular retaining groove. Each segment is formed of a superalloy such as Mar M-509 or Hastelloy X, with an MCrAlY, an aluminide, or a ceramic coating thereupon to protect the superalloy from oxidation and hot corrosion damage. The segment may optionally have cooling apertures or holes. The term "MCrAlY" denotes an alloy of nickel, cobalt, or iron, or a mixture thereof, to which chromium, aluminum, and yttrium have been added to achieve oxidation and hot corrosion resistance. The majority of current shrouds use (Ni,Co)CrAlY coatings.

While existing shroud designs and materials operate in an acceptable manner, there is a continuing need for improved shroud construction that achieve higher temperature capability at reduced cost of construction. This improved shroud construction allows engines to operate at higher temperatures, which in turn leads to either higher performance or better fuel efficiency. The present invention fulfills this need, and further provides related advantages.

SUMMARY OF THE INVENTION

The present invention provides a single crystal aircraft gas turbine shroud made of an environmentally resistant superalloy that requires no oxidation and corrosion resistant flowpath coating to achieve an acceptable operating life. The absence of a coating reduces the manufacturing cost of the shroud. Satisfactory operation without a coating also has the important benefit that engine life is not reduced in the event of scratches or other damage introduced to the shroud during operation of the engine, which otherwise would penetrate a coating and provide a site for the initiation of environmentally induced failures.

In accordance with the invention, a single crystal article for use in a gas turbine engine comprises a shroud segment having excellent environmental resistance and superior high temperature capability, being capable of extended use at temperatures of 2100° F. and above. The shroud segment preferably has a composition, in weight percent, of from about 5 to about 10 percent chromium, from about 5 to about 10 percent cobalt, from 0 to about 2 percent molybdenum, from about 3 to about 10 percent tungsten, from about 3 to about 8 percent tantalum, from 0 to about 2 percent titanium, from about 5 to about 7 percent aluminum, from 0 to about 6 percent rhenium, from 0 to about 0.50 percent hafnium, from 0 to about 0.07 percent carbon, from 0 to about 0.015 percent boron, and from 0 to about 0.075 percent yttrium, balance nickel. The shroud segment has a substantially single crystal microstructure. The shroud can be used in the as-cast condition or in the solution and aged condition. The shroud is operable with no oxidation and corrosion resistant flowpath coating required to achieve an acceptable operating life.

In a more preferred composition, a single crystal article for use in a gas turbine engine comprises a shroud segment having a composition, in weight percent, of from about 6.75 to about 7.25 percent chromium, from about 7.0 to about 8.0 percent cobalt, from about 1 3 to about 1.7 percent molybdenum, from about 4.75 to about 5.25 percent tungsten, from about 6.3 to about 6.7 percent tantalum, from 0 to about 0.02 percent titanium, from about 6.1 to about 6.3 percent aluminum, from about 2.75 to about 3.25 percent rhenium, from about 0.12 to about 0.18 percent hafnium, from about 0.04 to about 0.06 percent carbon, from about 0.003 to about 0.005 percent boron, from about 0.002 to about 0.030 percent yttrium, balance nickel, the shroud segment having a substantially single crystal microstructure.

This shroud construction is an advance in the art of gas turbine components, providing higher temperature capability, resulting in improved engine performance and efficiency. The elimination of NiCrAlY coatings results in a lower cost due to the elimination of manufacturing operations. The excellent environmental resistance of the shroud of the present invention results in a longer life due to a decrease in damage due to corrosion and oxidation. The single crystal design leads to improved mechanical properties, specifically improved stress rupture and thermal fatigue. Other features and advantages of the invention will be apparent from the following more detailed description of the preferred embodiment, taken in conjunction with the accompanying drawings, which illustrate, by way of example, the principles of the invention.

DETAILED DESCRIPTION OF THE PREFERRED EMBODIMENT

Figure 1:
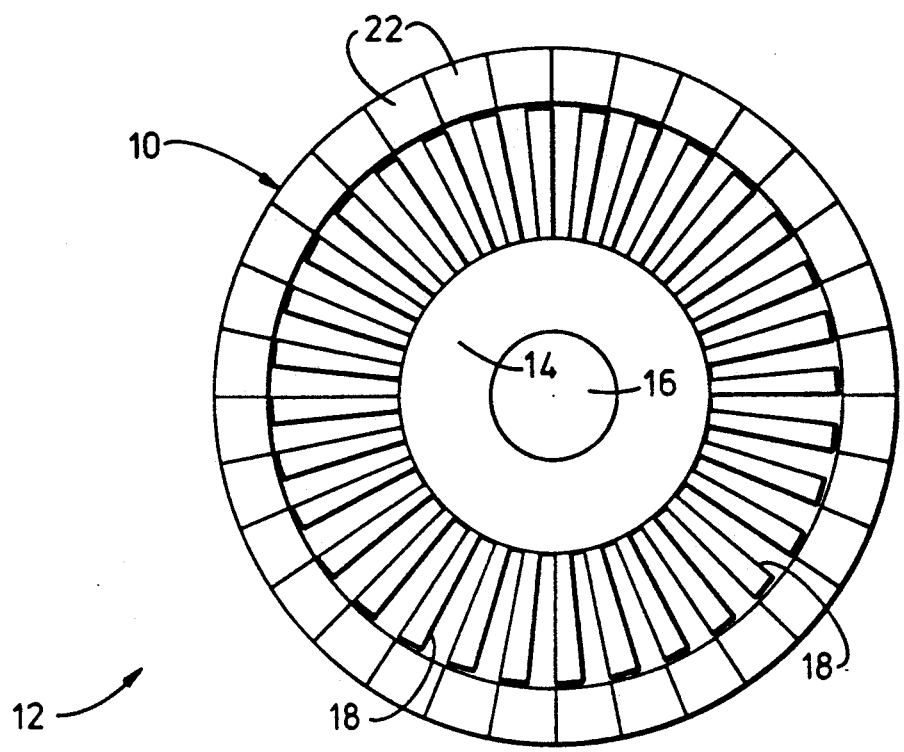
FIG. 1 is a perspective cutaway view of a high pressure stage of a gas turbine engine, illustrating the structure and placement of the shroud.

FIG. 1 illustrates the structure and placement of a shroud 10 in the high-pressure stage 12 of a gas turbine engine. A turbine disk 14 is of a generally cylindrical shape, and is mounted on a shaft 16 that permits the disk 14 to turn about its cylindrical axis. A plurality of turbine blades 18 are mounted on the periphery of the turbine disk 14, so that they move along a generally circular path around the circumference of the disk 14 as it turns.

The shroud 10 is a generally cylindrical housing whose innermost point is at a distance from the shaft 16 that is greater than the distance of the outermost point of the turbine blades 18 by some relatively small amount. As the engine operates, hot combustion gases flow through the high-pressure stage along a gas path (not shown) from the combustor toward the exhaust of the engine. The shroud confines the gas path so that the majority of the gas must pass through the path traversed by the turbine blades 18, rather than bypass the blades.

Figure 2:
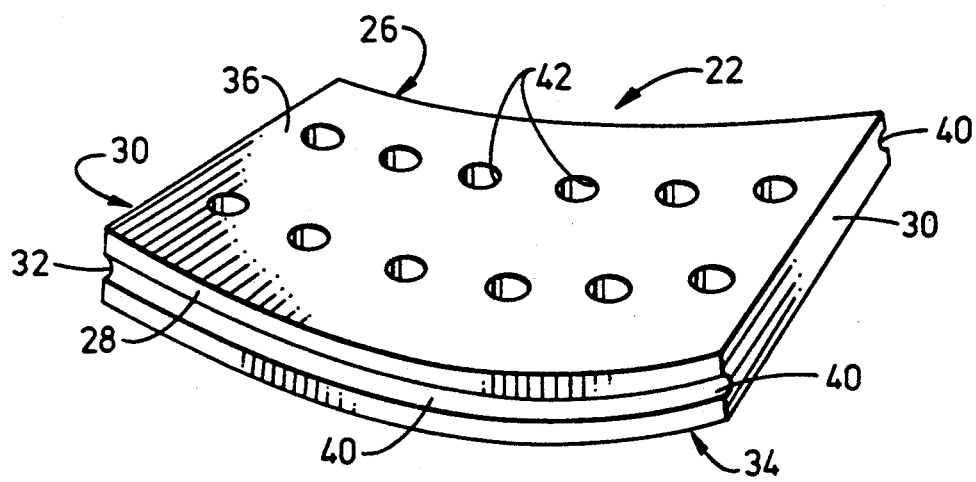
FIG. 2 is an enlarged perspective view of a shroud section.

The shroud 10 is made of a plurality of shroud segments 22, illustrated in FIG. 2. Each segment 22 is comprised of a leading edge side 26, which corresponds to the leading edge of the turbine blades, a trailing edge side 28, which corresponds to the trailing edge of the turbine blades, ends 30, apertures 42 extending through the segments 22 from the back face 34 to the flowpath face 36. Combustion gases flow across the flowpath face 36 to turn the turbine blades (not shown), in a direction from the leading edge side 26 to the trailing edge side 28. Each segment 22 forms only a part of the total circumference of the shroud structure 10. The shroud segments 22 are assembled on a track (not shown) using integral track engagements 40 machined or cast into the shroud segment 22 and terminating in the shroud ends 30, wherein shroud segments 22 join together.

Each shroud segment 22 is formed as a substantially single crystal component. As used herein, a "single crystal component" is one that is predominantly of a single crystal orientation throughout. The presence of low angle grain boundaries, small fractions of grains of different orientations, and other types of imperfections is acceptable in use of the shroud, and their presence does not remove a component from this characterization as a single crystal. Although the preparation of cast single crystal components for gas turbine use is well-known in the art, the use of a single crystal shroud is novel.

There are two commonly practiced procedures for accomplishing the preparation of single crystal components such as the single crystal shroud segment. In the seed crystal technique, an oriented seed crystal is grown into the liquid superalloy by unidirectionally propagating the liquid-solid interface. In the choke technique, the interface between liquid and solid is unidirectionally propagated through a labyrinth passage in a mold, with the result that the fastest growing orientation, $[001]_{fcc}$, emerges as the dominant growth direction. Any other technique that produces a single crystal article is also acceptable.

In accordance with the preferred embodiment of the invention, a single crystal article for use in a gas turbine engine comprises a shroud segment having a composition, in weight percent, of from about 6.75 to about 7.25 percent chromium, about 7.0 to about 8.0 percent cobalt, from about 1.3 to about 1.7 percent molybdenum, from about 4.75 to about 5.25 percent tungsten, from about 6.3 to about 6.7 percent tantalum, from 0 to about 0.02 percent titanium, from about 6.1 to about 6.3 percent aluminum, from about 2.75 to about 3.25 percent rhenium, from about 0.12 to about 0.18 percent hafnium, from about 0.04 to about 0.06 percent carbon, from about 0.003 to about 0.005 percent boron, from about 0.002 to about 0.030 percent yttrium, balance nickel, the shroud segment having a substantially single crystal microstructure. The shroud is a cast structure, but optionally may be used in the solution treated and aged condition.

The superalloy used is a gamma/gamma-prime alloy which may be cast as a single crystal shroud and placed in service in this condition. However, the gamma phase is a solid solution strengthened, face-centered cubic phase, and the gamma-prime phase is an intermetallic phase generally of the composition $Ni_3Al$, which also may be solid solution strengthened and aged to achieve mechanical properties superior to the as-cast condition. However, the shroud may be cast and placed in service in this condition. To attain the improved mechanical properties of the optional solutioned and aged structure, the shroud is heat treated by first solutionizing at high temperature and then aging to produce a distribution of the gamma-prime phase. The heat treatment is a solutionizing treatment at a temperature and for a time sufficient to place at least about 95 percent of the gamma prime phase into solution, followed by an intermediate aging treatment and a final aging treatment. An operable heat treatment is solutionizing at 2350°-2400° F. for two hours (in a ⅛ inch thick piece), cooling to 2000° F. at 100° F. per minute, further cooling to 1200° F. in 60 minutes or less, intermediate aging at 1975° F. for 4 hours, cooling to below 1200° F. in 6 minutes or less, and final aging at 1650° F. for 16 hours. The microstructural result of this heat treatment is a duplex array of large and small gamma-prime particles in a gamma matrix, with the gamma-prime particles occupying about 60 percent of the volume and the gamma matrix occupying about 40 percent of the volume.

The particular alloying elements in the superalloy composition used in the shroud, and their quantitative amounts and limits, were selected with attention to their properties in combination. That is, the presence and amount of each element was selected with consideration of the effect on the other alloying elements in the superalloy. These properties include the strength and creep rupture properties of the alloy and the individual phases, the resistance of the alloy to the formation of instabilities such as brittle phases during elevated temperature exposure, and the environmental resistance of the alloy to oxidation and hot corrosion damage.

The chromium content of the alloy is from about 5 to about 10 weight percent, preferably from about 6.75 to about 7.25 weight percent, and most preferably about 7 percent. Chromium provides resistance to hot corrosion and oxidation damage. If the amount of chromium is too low, the hot corrosion resistance falls to unacceptably low levels. If the chromium level is raised above the indicated limit, it contributes to the formation of an undesirable brittle topologically closed packed (TCP) phase during elevated temperature service.

The cobalt content is from about 5 to about 10 weight percent, preferably from about 7.0 to about 8.0 weight percent, and most preferably about 7.5 weight percent. The cobalt aids in stabilizing the alloy against the formation of the TCP phase during extended operation at elevated temperature, and improves its castability during fabrication of the article. If the cobalt content is too small, the stability against TCP formation is unacceptably reduced. If the cobalt content is too high, the rupture strength of the alloy is reduced.

The molybdenum content is from 0 to about 2 weight percent, preferably from about 1.3 to about 1.7 weight percent, and most preferably about 1.5 weight percent. Molybdenum aids in solid solution strengthening the gamma phase. Its effect is not strong, and therefore small amounts are used. Too much molybdenum reduces the oxidation resistance of the alloy.

The tungsten content is from about 3 to about 10 weight percent, preferably from about 4.75 to about 5.25 weight percent, and most preferably about 5.0 weight percent. Tungsten partitions almost equally to the gamma and gamma-prime phases, and strengthens each phase by solid solution strengthening. Tungsten is very heavy, and increases the density of the alloy. If the tungsten content is too low, the strength of the alloy is insufficient. In particular, the strength of the gamma phase may be too low. Too high a tungsten content increases the density unacceptably and also reduces the oxidation and hot corrosion resistance of the alloy.

The tantalum content is from about 3 to about 8 weight percent, preferably from about 6.3 to about 6.7 percent, and most preferably about 6.5 percent. Tantalum is a gamma-prime phase strengthening element, and also provides resistance to hot cracking and freckle formation on castings. If the tantalum content is too low, the strength of the alloy is too low. If the tantalum content is too high, there is an increased tendency to formation of TCP phase during extended elevated temperature exposure.

The aluminum content is from about 5 to about 7 weight percent, preferably from about 6.1 to about 6.3 percent, and most preferably about 6.2 percent. Aluminum is the principal alloying element in the formation of the gamma-prime phase, and also contributes to oxidation resistance by contributing aluminum to the formation of surface aluminum oxides. If the aluminum content is too low, there is an insufficient volume fraction of gamma prime phase to achieve good strength and creep rupture resistance, and the oxidation resistance of the alloy is low. If the aluminum content is too high, there is an increased tendency to form the brittle TCP phase during extended exposure at elevated temperatures.

The titanium content is from 0 to about 2 weight percent, preferably 0.02 weight percent maximum, and most preferably zero. Titanium, when present, may partially substitute for aluminum in the gamma-prime phase, so that the resulting phase is $Ni_3(Al,Ti)$. Titanium is a low melting point element, and tends to decrease the melting point of the superalloy. Its presence is also detrimental to oxidation resistance. The titanium content is therefore kept as low as possible, preferably zero.

The rhenium content is from 0 to about 6 weight percent, preferably from about 2.75 to about 3.25 weight percent, most preferably about 3.0 weight percent. Rhenium, while relatively dense, is a potent solid solution strengthening element in the gamma phase and is important in achieving high temperature strength of the alloy. A low level of rhenium has been substituted for other, less potent solid solution strengthening elements such as molybdenum and chromium. If the rhenium content is too low, in relation to the selected contents of the other elements, then the strength of the alloy is too low. If the rhenium content is too high, there is an increased tendency to form TCP phase during extended exposure to elevated temperatures.

Hafnium, carbon, and boron are grain boundary strengthening elements. It has been conventional practice to omit them entirely from single crystal alloys. However, they are provided in relatively low levels in the present alloy to promote strengthening of subgrain boundaries that are frequently present even in articles that are nominally single crystals. Where these elements are omitted from the alloy, subgrain boundaries having boundary misorientations greater than about 6 degrees are unacceptable in an article, and the articles containing such higher angle boundaries are normally discarded. Including a small amount of these grain boundary strengthening elements provides sufficient strength to the boundaries that articles having subgrain boundaries of up to about 12 degrees misorientation are acceptable. These elements therefore increase the percentage of acceptable cast articles, by reducing the percentage that must be discarded due to the presence of high angle boundaries. However, each of these elements acts to decrease the melting point of the alloy and the gamma-prime solvus temperature. Too much of any of hafnium, carbon, or boron will reduce these temperatures by an unacceptable amount.

The yttrium content is from 0 to about 0.075 weight percent, preferably from about 0.002 to about 0 030 percent, most preferably about 0.01 weight percent. Yttrium promotes oxidation resistance. Too much yttrium causes the superalloy to react with conventional silica and zirconia ceramic casting molds, and necessitates the use of aluminum oxide casting molds.

The most preferred alloy of the invention was comparatively evaluated in various types of testing and in actual gas turbine operation. The following examples are intended to illustrate aspects of the invention, and should not be taken as limiting of the invention in any respect.

EXAMPLE 1

Specimens were placed into a Mach 1 burner rig at 2150° F. and comparatively evaluated for dimensional reduction in mils (0.001 inch) per face after 200 hours of exposure. Three specimens of the preferred alloy of the invention experienced losses of from 0.6 to 1.0 mils. Three specimens of Mar M-509 coated with a conventional (Ni,Co)CrAlY coating experienced losses from 1.0 to 1.7 mils per face. Three specimens of directionally solidified Rene 142 experienced losses of from 0.5 to 1.1 mils per face. Three specimens of conventionally cast Rene 142 experienced losses of from 0.2 to 0.4 mils per face. One specimens of Hastelloy X experienced a loss of 45 mils per face. A specimen of uncoated Mar M-509 was tested at 2100° F., and the results extrapolated to 2150° F. and 200 hours. The extrapolation indicated a loss of about 100 mils per face.

The alloy of the invention has an acceptably low oxidation loss, comparable with that of several other materials and much less than that of uncoated Mar M-509.

EXAMPLE 2

Specimens were tested in thermal fatigue cycling. Each cycle included heating from 800° F. to a maximum temperature in 8 seconds, holding for 48 seconds at the maximum temperature, cooling to 1200° F. in 8 seconds, and further cooling to 800° F. in 8 seconds. Each specimen was subjected to 1000 cycles at maximum temperatures of 1950° F., 2000° F., 2050° F., 2100° F., 2150° F., and 2175° F. for a total of 6000 cycles per specimen.

Microscopic evaluation of the specimens revealed that the preferred alloy of the invention and Mar M-509 coated with a (Ni,Co)CrAlY coating exhibited no cracking and excellent oxidation appearance. Directionally solidified Rene 142 exhibited some cracking and had significant oxidation pitting and surface eruptions. Conventionally cast Rene 142 exhibited edge cracks after 1000 cycles at 1950° F., the least severe condition, and that the cracks propagated during subsequent cycles. The surface had extensive oxidation damage.

The testing of Examples 1 and 2 led to the conclusion that the uncoated preferred alloy of the invention was comparable in performance with a presently used coated system of Mar M-509 with (Ni,Co)CrAlY coating. Uncoated Mar M-509 oxidizes rapidly. The alloy of the invention therefore has the important advantage of achieving comparable performance with Mar M-509 without the concern of degradation of properties if some of the coating is lost by spalling, scratching, or otherwise. The Rene 142 exhibited unacceptable thermal fatigue cycling. The oxidation behavior of Rene 142 also depends upon controlling the yttrium content precisely, which may be difficult in mass production.

EXAMPLE 3

A high pressure turbine shroud for an F110 aircraft gas turbine was constructed of alternating segments of the preferred alloy of the invention and Mar M-509 coated with (Ni,Co)CrAlY, the two best materials from the testing of Examples 1 and 2. The engine was operated for 166 hours in Evendale, Ohio. After the testing was complete, the engine was disassembled and the shroud segments examined.

The shroud segments of the alloy of the invention exhibited less edge cracking than the coated Mar M-509 shrouds. In a region behind a bad burner nozzle, the coated Mar M-509 shroud was badly burned, while the shroud of the present invention, in the as-cast form, was significantly less damaged, demonstrating that the shroud of the present invention has a temperature capability improvement of at least 75° F. over Mar M-509. No hot corrosion was observed in shrouds made from either material.

EXAMPLE 4

Example 3 was repeated on a CF6 aircraft gas turbine, except that the flowpath face of the shroud segments of the alloy of the invention were not coated, while all other surfaces were coated with an aluminide coating by the CODEP process of U.S. Pat. Nos. 3,415,672 and 3,540,878, whose disclosures are incorporated by reference. The engine was operated in an environment about 1 kilometer from the ocean and in an area of potentially high industrial pollution. The engine was operated for 700 hours and experienced 2750 cycles, and was disassembled for inspection and measurement after testing.

The shroud segments of the present invention had metal losses on the flowpath faces of 2-3 mils, and on the back faces of 0-4 mils. Small amounts of hot corrosion were noted on the flowpath faces of the shroud of the present invention, and the combined oxidation/hot corrosion metal loss was 1-8 mils. The coated Mar M-509 shroud segments had severe oxidation and metal losses on the flowpath faces of 8-16 mils and on the back faces of 0-6 mils. The cooling holes or apertures of the shroud segments of the present invention showed little damage, while those of the coated Mar M-509 shroud had somewhat higher damage. The uncoated shroud of the present invention therefore achieves significantly improved performance, even as compared to a shroud system made from other current alloys such as Mar M-509 coated with a flowpath face coating.

The tests of Example 3 demonstrated that shroud segments of the present invention having an uncoated flowpath achieves superior performance to that of coated Mar M-509 shroud segments operated in a non-corrosive environment. The tests of Example 4 demonstrated that the uncoated flowpath of the shroud segments of the present invention achieved superior performance to that of coated Mar M-509 in a corrosive environment. However, in corrosive environments, testing indicates that it is necessary to coat apertures or cooling holes with aluminide coatings such as CODEP to achieve the full potential improvement in temperature provided by shroud segements of the present invention. The uncoated alloy of the invention experiences hot corrosion in cooling holes, where present, particularly when operated in a corrosive environment.

The approach of the present invention thus provides a material for use in uncoated gas turbine engine shrouds that performs as well as, or superior to, convent coated alloys. A protective coating in the apertures 42 or cooling holes, the sides 26, 28 and the ends 30, preferably is applied to the shrouds of the present invention, but not to the flowpath faces. Although the present invention has been described in connection with specific examples and embodiments, it will be understood by those skilled in the arts involved, that the present invention is capable of modification without departing from its spirit and scope as represented by the appended claims.

What is claimed is:

1. An uncoated, cast shroud segment for use in a gas turbine engine at temperatures up to at least 2100° F., comprising a substantially single crystal microstructure which is solution treated and aged and having a composition, in weight percent, of from a bout 6.75 to about 7.25 percent chromium, from about 7.0 to about 8.0 percent cobalt, from about 1.3 to about 1.7 percent molybdenum, from about 4.75 to about 5.25 percent tungsten, from a bout 6.3 to about 6.7 percent tantalum, from about 0 to about 0.02 percent titanium, from about 6.1 to about 6.3 percent aluminum, from about 2.75 to about 3.25 percent rhenium, from about 0.12 to about 0.18 percent hafnium, from about 0.04 to about 0.06 percent carbon, from about 0.003 to about 0.005 percent boron, from about 0.002 to about 0.030 percent yttrium, balance nickel, wherein the uncoated shroud segment exhibits improved oxidation resistance at elevated temperatures, the improved oxidation resistance being measured by a weight loss of about 1.0 mil or less at a temperature of about 2150° F. for a time of about 200 hours by a Mach 1 burner rig test.

2. An uncoated, cast shroud segment for use in a gas turbine engine at temperatures up to at least 2100° F., comprising a substantially single crystal microstructure having a composition, in weight percent, of about 7 percent chromium, about 7.5 percent cobalt, about 1.5 percent molybdenum, about 5.0 percent tungsten, about 6.5 percent tantalum, a substantial absence of titanium, about 6.2 percent aluminum, about 3.0 percent rhenium about 0.15 percent hafnium, about 0.05 percent carbon, about 0.004 percent boron, about 0.01 percent yttrium, balance nickel, wherein the uncoated shroud segment exhibits improved oxidation resistance at elevated temperatures, the improved oxidation resistance being measured by a weight loss of about 1.0 mil or less at a temperature of about 2150° F. for a time of about 200 hours by a Mach 1 burner rig test.

3. A cast shroud for sue in a gas turbine engine at temperatures up to at least 2100° F., in which hot combustion gases impinge upon a surface of the shroud along a flow path, the shroud comprising a substantially single crystal microstructure having a composition, in weight percent, of from about 6.75 to about 7.25 percent chromium, from about 7.0 to about 8.0 percent cobalt, from about 1.3 to about 1.7 percent molybdenum, from about 4.75 to about 5.25 percent tungsten, from about 6.3 to about 6.7 percent tantalum, from about 0 to about 0.02 percent titanium, from about 6.1 to about 6.3 percent aluminum, from a bout 2.75 to about 3.25 percent rhenium, from about 0.12 to about 0.18 percent hafnium, from about 0.04 to about 0.06 percent carbon, from about 0.003 to about 0.005 percent boron, from about 0.002 to about 0.030 percent yttrium, balance nickel, wherein the shroud flowpath surface is not coated with an oxidation and corrosion resistant coating and wherein the uncoated shroud flowpath exhibits improved oxidation resistance at elevated temperatures, the improved oxidation resistance being measured as a weight loss of about 1.0 mil or less at a temperature of about 2150° F. for a time of about 200 hours.

* * * * *